(12) United States Patent
Kumei

(10) Patent No.: US 9,812,843 B2
(45) Date of Patent: Nov. 7, 2017

(54) METHOD FOR PRODUCING LIGHT-EMITTING DEVICE

(71) Applicant: FUJI XEROX CO., LTD., Tokyo (JP)

(72) Inventor: Masaya Kumei, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/205,152

(22) Filed: Jul. 8, 2016

(65) Prior Publication Data

US 2017/0063041 A1    Mar. 2, 2017

(30) Foreign Application Priority Data

Aug. 31, 2015    (JP) .................. 2015-170315

(51) Int. Cl.
| | | |
|---|---|---|
| *H01S 5/183* | (2006.01) | |
| *H01S 5/343* | (2006.01) | |
| *H01S 5/042* | (2006.01) | |
| *H01S 5/00* | (2006.01) | |
| *H01S 5/20* | (2006.01) | |

(52) U.S. Cl.
CPC ........ *H01S 5/18313* (2013.01); *H01S 5/0021* (2013.01); *H01S 5/0425* (2013.01); *H01S 5/2068* (2013.01); *H01S 5/3432* (2013.01); *H01S 2301/176* (2013.01)

(58) Field of Classification Search
None
See application file for complete search history.

(56) References Cited

U.S. PATENT DOCUMENTS

| | | | | |
|---|---|---|---|---|
| 6,201,825 | B1 * | 3/2001 | Sakurai | .................. B82Y 20/00 257/13 |
| 2003/0235226 | A1 | 12/2003 | Ueki | |
| 2004/0124424 | A1 | 7/2004 | Tatsumi | |
| 2010/0201280 | A1 * | 8/2010 | McKenzie | .............. H01L 33/46 315/246 |
| 2011/0117726 | A1 * | 5/2011 | Pinnington | ....... H01L 21/02389 438/458 |

(Continued)

FOREIGN PATENT DOCUMENTS

| | | |
|---|---|---|
| JP | 06-503919 A | 4/1994 |
| JP | 08-255837 A | 10/1996 |

(Continued)

OTHER PUBLICATIONS

Communication dated Nov. 8, 2016, from the Japanese Patent Office in counterpart Japanese application No. 2015-170315.

(Continued)

*Primary Examiner* — Angel Roman
*Assistant Examiner* — Kevin Quinto
(74) *Attorney, Agent, or Firm* — Sughrue Mion, PLLC

(57) ABSTRACT

A method for producing a light-emitting device includes oxidizing a current confinement layer containing Al by steam oxidation from a side face of a light-emitting element portion including the current confinement layer to form a current confinement structure in the light-emitting element portion; heating the light-emitting element portion to about 150° C. or higher and about 400° C. or lower at reduced pressure for a predetermined heating time while the oxidized current confinement layer is exposed at the side face; and after the light-emitting element portion is heated, forming a protective film on the side face.

18 Claims, 12 Drawing Sheets

(56) References Cited

U.S. PATENT DOCUMENTS

2013/0267077 A1* 10/2013 Hong .................... C23C 14/568
                                                                      438/478

FOREIGN PATENT DOCUMENTS

| JP | 11-233513 A | 8/1999 |
| --- | --- | --- |
| JP | 2004-23087 A | 1/2004 |
| JP | 2004-193330 A | 7/2004 |
| JP | 2005-317816 A | 11/2005 |
| JP | 2007-194440 A | 8/2007 |
| JP | 2009-218266 A | 9/2009 |
| JP | 2012-019195 A | 1/2012 |
| JP | 2013-165262 A | 8/2013 |
| JP | 2013-197220 A | 9/2013 |
| JP | 2014-132692 A | 7/2014 |
| JP | 2015-103727 A | 6/2015 |
| WO | 92/12536 A1 | 7/1992 |

OTHER PUBLICATIONS

Communication dated Feb. 28, 2017, issued from the Japanese Patent Office in counterpart Application No. 2015-170315.
Communication dated Aug. 9, 2016, from the Japanese Patent Office in counterpart Japanese application No. 2015-170315.

* cited by examiner

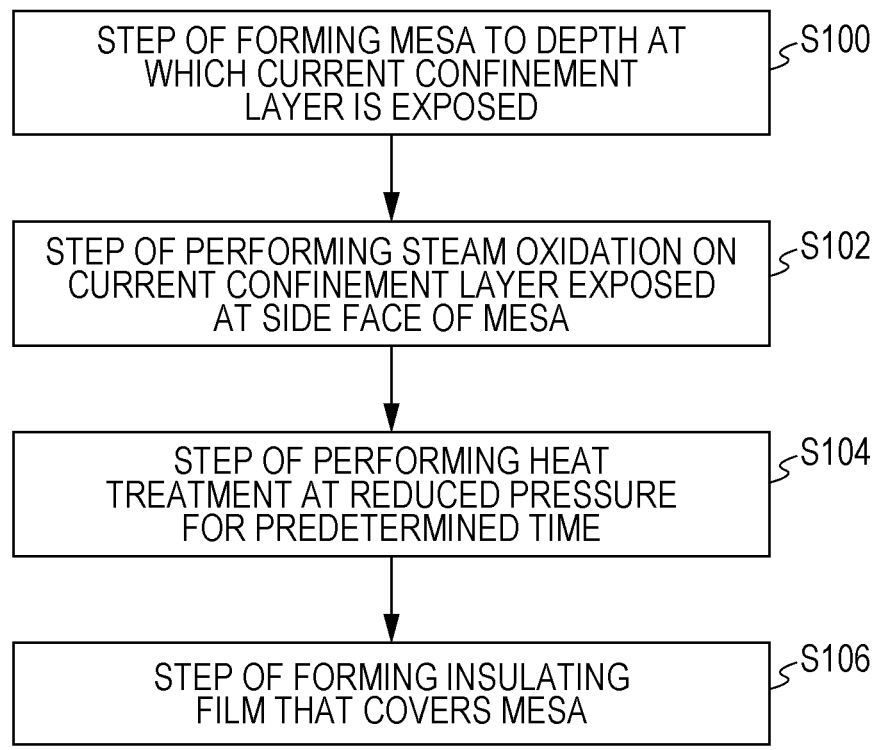

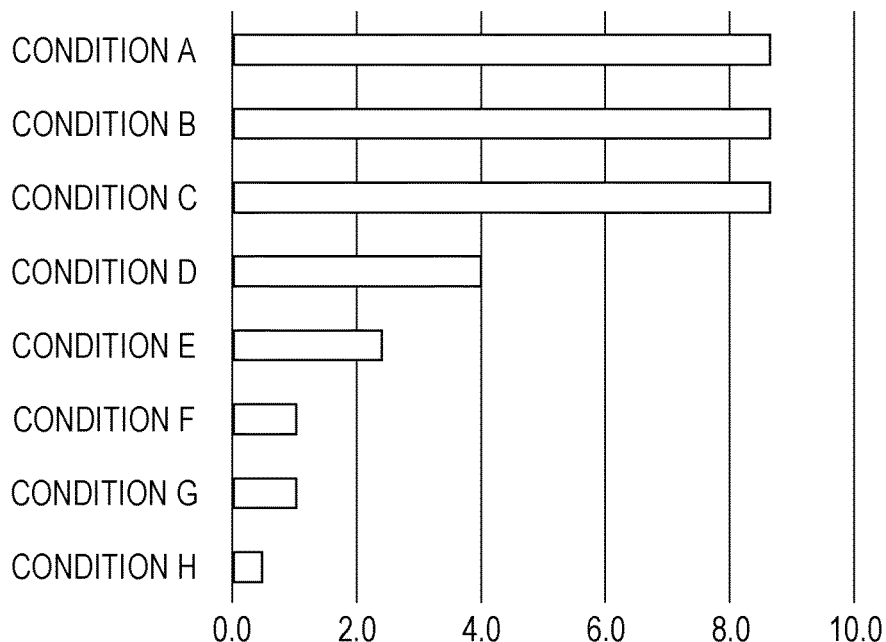

FIG. 7B

TIME REQUIRED UNTIL OPTICAL OUTPUT DECREASES
TO 75% OF INITIAL VALUE = LIFE TIME
NORMALIZATION WITH LIFE TIME OF CONDITION G (TIMES)

FIG. 7C

| SYMBOL | CONDITIONS |
|---|---|
| A | AFTER HEATING IN NITROGEN ATMOSPHERE AT 50 Pa AT 400°C FOR 1 HOUR, FILM IS FORMED BY CVD AT 250°C |
| B | AFTER HEATING IN NITROGEN ATMOSPHERE AT 50 Pa AT 305°C FOR 1 HOUR, FILM IS FORMED BY CVD AT 250°C |
| C | AFTER HEATING IN NITROGEN ATMOSPHERE AT 50 Pa AT 192°C FOR 1 HOUR, FILM IS FORMED BY CVD AT 250°C |
| D | AFTER HEATING IN NITROGEN ATMOSPHERE AT 50 Pa AT 305°C FOR 15 MINUTES, FILM IS FORMED BY CVD AT 250°C |
| E | AFTER HEATING IN NITROGEN ATMOSPHERE AT 50 Pa AT 155°C FOR 1 HOUR, FILM IS FORMED BY CVD AT 250°C |
| F | AFTER HEATING IN NITROGEN ATMOSPHERE AT 50 Pa AT 105°C FOR 1 HOUR, FILM IS FORMED BY CVD AT 250°C |
| G | AFTER HEATING IN NITROGEN ATMOSPHERE AT 50 Pa AT LOWER THAN 250°C FOR SHORTER THAN 5 MINUTES, FILM IS FORMED BY CVD AT 250°C |
| H | AFTER HEATING IN NITROGEN ATMOSPHERE AT 101325 Pa (ATMOSPHERIC PRESSURE) AT 305°C FOR 1 HOUR, FILM IS FORMED BY CVD AT 250°C |

METHOD FOR PRODUCING LIGHT-EMITTING DEVICE

CROSS-REFERENCE TO RELATED APPLICATIONS

This application is based on and claims priority under 35 USC 119 from Japanese Patent Application No. 2015-170315 filed Aug. 31, 2015.

BACKGROUND (i) Technical Field

The present invention relates to a method for producing a light-emitting device.

(ii) Related Art

Vertical cavity surface emitting lasers have been used as a light source for electronic apparatuses and the like because they are capable of emitting laser beams in a direction perpendicular to a substrate and an array is easily formed by two-dimensional integration. Such vertical cavity surface emitting lasers are applicable to, for example, light sources for forming latent images on a photosensitive member incorporated in a printer, light sources for optical communications, and light sources for optical mice.

Typical vertical cavity surface emitting lasers include a pair of distributed Bragg reflectors (DBRs) disposed on a semiconductor substrate, an active layer disposed between the pair of DBRs, and a cavity spacer layer. When an electric current is injected into the active layer through electrodes disposed on outer sides of the DBRs, lasing occurs in a direction perpendicular to the substrate. Many of vertical cavity surface emitting lasers currently put to practical use include an oxide confinement layer formed by performing steam oxidation on an AlAs or AlGaAs layer having a high Al content for the purpose of decreasing the threshold of electric current and controlling transverse modes. Such a vertical cavity surface emitting laser is referred to as an oxidized vertical cavity surface emitting laser. Many crystal defects generated by distortion due to oxidation are present in semiconductor crystals near the AlAs or AlGaAs layer that has been subjected to steam oxidation.

In oxidized vertical cavity surface emitting lasers, even when the same electric current is injected, the optical output decreases as the operating time increases. One of the causes of the degradation is as follows. Dislocation caused from crystal defects in the oxide confinement layer grows to an active layer in a light-emitting region using energy that comes from heat generated and electric current supplied during driving of the device, which prevents the active layer from emitting light.

SUMMARY

According to an aspect of the invention, there is provided a method for producing a light-emitting device, the method including oxidizing a current confinement layer containing Al by steam oxidation from a side face of a light-emitting element portion including the current confinement layer to form a current confinement structure in the light-emitting element portion; heating the light-emitting element portion to about 150° C. or higher and about 400° C. or lower at reduced pressure for a predetermined heating time while the oxidized current confinement layer is exposed at the side face; and, after the light-emitting element portion is heated, forming a protective film on the side face.

BRIEF DESCRIPTION OF THE DRAWINGS

Exemplary embodiments of the present invention will be described in detail based on the following figures, wherein:

FIG. 2 is a flowchart for illustrating a heat treatment in a production process of a vertical cavity surface emitting laser according to an exemplary embodiment of the invention.

FIGS. 7A to 7C illustrate the comparison of optical output between vertical cavity surface emitting lasers subjected to heat treatment according to an exemplary embodiment of the invention and known vertical cavity surface emitting lasers.

DETAILED DESCRIPTION

Figure 1:
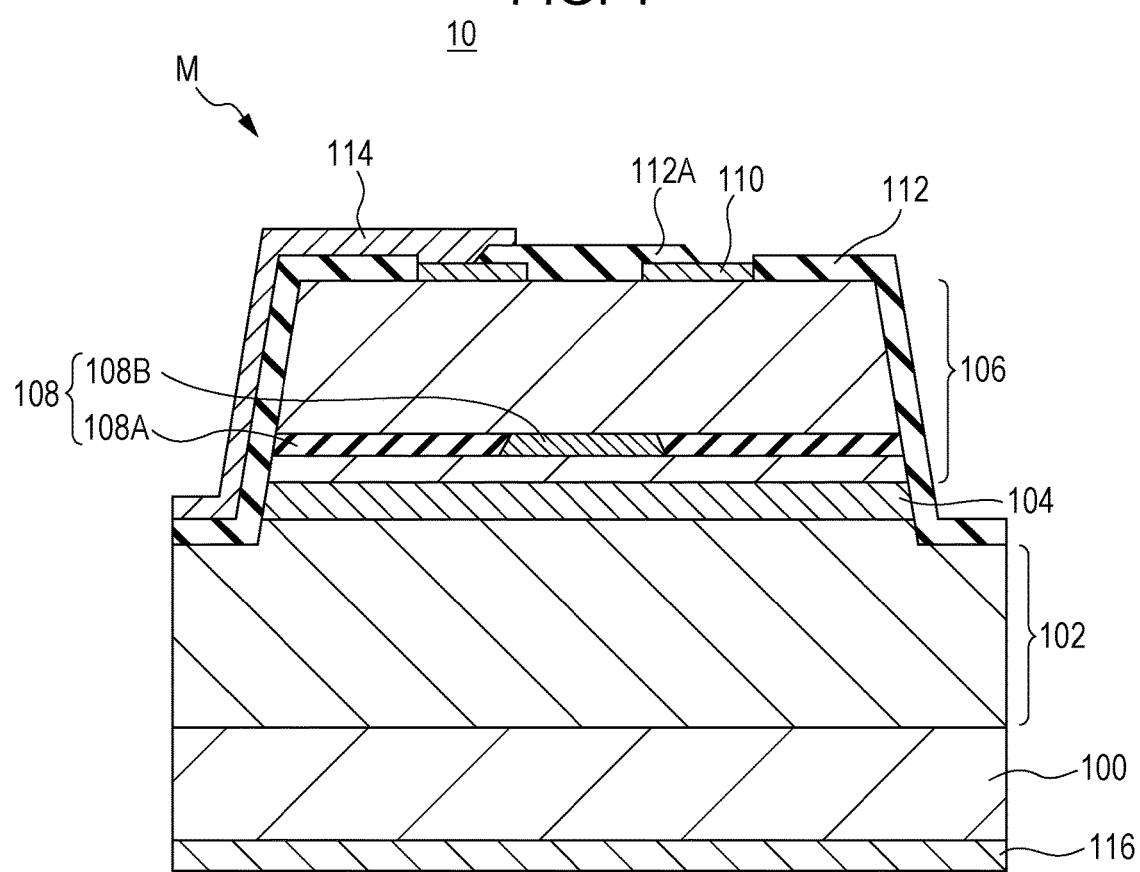
FIG. 1 is a schematic sectional view illustrating a vertical cavity surface emitting laser according to an exemplary embodiment of the invention.

Next, exemplary embodiments according to the invention will be described with reference to the attached drawings. The present invention is applicable to methods for producing various light-emitting devices such as vertical cavity surface emitting lasers, light-emitting thyristors, and light-emitting diodes. The present invention is also applicable to a method for producing a light-emitting device in which a semiconductor layer containing an Al component is oxidized. The semiconductor layer containing an Al component is used as, for example, a current confinement layer or an oxide confinement layer of light-emitting devices. In the following description of the exemplary embodiments, a vertical cavity surface emitting laser (VCSEL) is exemplified as the light-emitting device, and the vertical cavity surface emitting laser is referred to as a "VCSEL". Note that the scale of the drawings is emphasized to facilitate the understanding of the features of the invention, and thus is not necessarily the same as that of actual devices.

Exemplary Embodiment

In a typical method for producing a vertical cavity surface emitting laser device, crystal defects that cause a decrease in optical output are suppressed by controlling the concentrations of oxide compounds and oxygen compounds in a semiconductor crystal to predetermined values or less in a crystal growth process. However, such a method does not suppress the formation of crystal defects near a current confinement layer that is made of AlAs or AlGaAs and has been subjected to steam oxidation and the generation of substances that induce the crystal defects. For example, when a current confinement layer made of AlAs is subjected to steam oxidation, reactions represented by reaction formulae below are caused. In the principal reaction, Al of AlAs is oxidized into $Al_2O_3$, which is a stable oxide with electric insulation. In the side reactions, however, aluminum hydroxide having a hydroxy group, such as AlO(OH) or AlO(OH)$_3$, is generated. It is believed that when a vertical cavity surface emitting laser is operated, the hydroxy group, which is relatively instable, moves from the current confinement layer to an active layer while repeatedly bonding to and separating from Al, resulting in formation of crystal defects in the active layer. With further energization, the crystal defects grow to cause dislocation, which triggers a decrease in laser beam output.

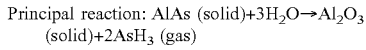

Principal reaction: AlAs (solid)+$3H_2O$→$Al_2O_3$ (solid)+$2AsH_3$ (gas)

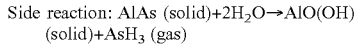

Side reaction: AlAs (solid)+$2H_2O$→AlO(OH) (solid)+$AsH_3$ (gas)

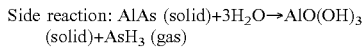

Side reaction: AlAs (solid)+$3H_2O$→AlO(OH)$_3$ (solid)+$AsH_3$ (gas)

Therefore, if a steam oxidation process is employed for vertical cavity surface emitting laser devices, many crystal defects are formed near the current confinement layer and substances that induce the crystal defects are left in the current confinement layer, which is believed to trigger a decrease in optical output with the operation time elapsed. Hereafter, the structure and production method of the VCSEL according to this exemplary embodiment will be described in detail.

FIG. 1 is a schematic sectional view illustrating an example of a structure of a VCSEL according to an exemplary embodiment of the invention. As illustrated in FIG. 1, a VCSEL 10 includes, on an n-type GaAs substrate 100, an n-type lower distributed Bragg reflector (DBR) 102 obtained by alternately stacking low-refractive-index layers and high-refractive-index layers, an active region 104 formed on the lower DBR 102, and a p-type upper DBR 106 formed on the active region 104 by alternately staking low-refractive-index layers and high-refractive-index layers. These semiconductor layers are formed through a series of epitaxial growth. A cylindrical mesa (columnar structure) M extending from the upper DBR 106 to the lower DBR 102 is formed on the substrate 100.

The lower DBR 102 is, for example, a multilayer body including n-type $Al_{0.9}Ga_{0.1}As$ layers and $Al_{0.3}Ga_{0.7}As$ layers each having a thickness of $\lambda/(4n_r)$ ($\lambda$: lasing wavelength, $n_r$: refractive index of a medium), and 40.5 pairs of these layers are alternately stacked. The carrier concentration after doping with silicon serving as an n-type impurity is, for example, $3\times10^{18}$ cm$^{-3}$.

The active region 104 includes a quantum well active layer sandwiched between upper and lower spacer layers. The lower spacer layer is, for example, an undoped $Al_{0.6}Ga_{0.4}As$ layer. The quantum well active layer is constituted by, for example, an undoped $Al_{0.11}Ga_{0.89}As$ quantum well layer and an undoped $Al_{0.3}Ga_{0.7}As$ barrier layer. The upper spacer layer is, for example, an undoped $Al_{0.6}Ga_{0.4}As$ layer.

The upper DBR 106 is, for example, a multilayer body including p-type $Al_{0.9}Ga_{0.1}As$ layers and $Al_{0.3}Ga_{0.7}As$ layers each having a thickness of $\lambda/(4n_r)$ ($\lambda$: lasing wavelength, $n_r$: refractive index of a medium), and about 20 to 30 pairs of these layers are alternately stacked. The carrier concentration after doping with carbon serving as a p-type impurity is, for example, $3\times10^{18}$ cm$^{-3}$. A contact layer made of p-type GaAs is formed in an uppermost layer of the upper DBR 106. The carrier concentration of the contact layer is, for example, $1\times10^{19}$ cm$^{-3}$. A current confinement layer 108 made of p-type AlGaAs or AlAs with a high Al content is formed in a lowermost layer of the upper DBR 106 or inside the upper DBR 106. The current confinement layer 108 is selectively oxidized in an oxidation process as described below, and a current confinement structure having a conductive region (oxidation aperture) 108B surrounded by an oxidized region 108A is formed.

A ring-shaped p-side electrode 110 made of stacked metals such as Ti/Au is formed on the upper DBR 106. A circular light-emitting aperture is formed at the center of the p-side electrode 110, and the center of the light-emitting aperture substantially agrees with the center (optical axis) of the conductive region 108B. The p-side electrode 110 is electrically connected to the upper DBR 106 and used to inject carriers into the upper DBR 106.

An interlayer insulating film 112 is formed so as to cover the bottom, side face, and top outer edge of the mesa M. The interlayer insulating film 112 is, for example, a dielectric film made of SiN (silicon nitride film), SiON (silicon oxynitride film), $SiO_2$ (silicon dioxide film), or the like. Furthermore, a circular emission protective film 112A is formed so as to cover the light-emitting aperture of the p-side electrode 110. The emission protective film 112A and the interlayer insulating film 112 may be formed at the same time or may be formed in different processes.

A contact hole for exposing the p-side electrode 110 is formed between the interlayer insulating film 112 and the emission protective film 112A, and a metal wiring line 114 is connected to the p-side electrode 110 through the contact hole. The metal wiring line 114 extends along the side face and bottom face of the mesa M and is connected to an electrode pad (not illustrated) or the like. An n-side electrode 116 is formed on the bottom face of the substrate 100.

Although not illustrated in FIG. 1, an intermediate layer (graded layer) having a GaAs/AlAs mixed crystal ratio which is between mixed crystal ratios of the $Al_{0.9}Ga_{0.1}As$ layer and the $Al_{0.3}Ga_{0.7}As$ layer may be inserted into at least one of the p-type upper DBR 106 and the n-type lower DBR 102 in order to decrease the series resistance of the laser device.

Figure 3A:
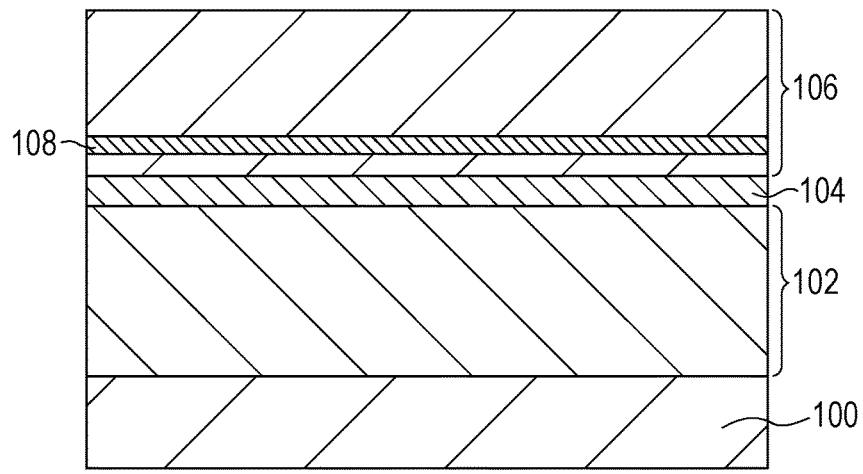
FIGS. 3A to 3C are process sectional views schematically illustrating a method for producing a vertical cavity surface emitting laser according to an exemplary embodiment of the invention.
Figure 3B:
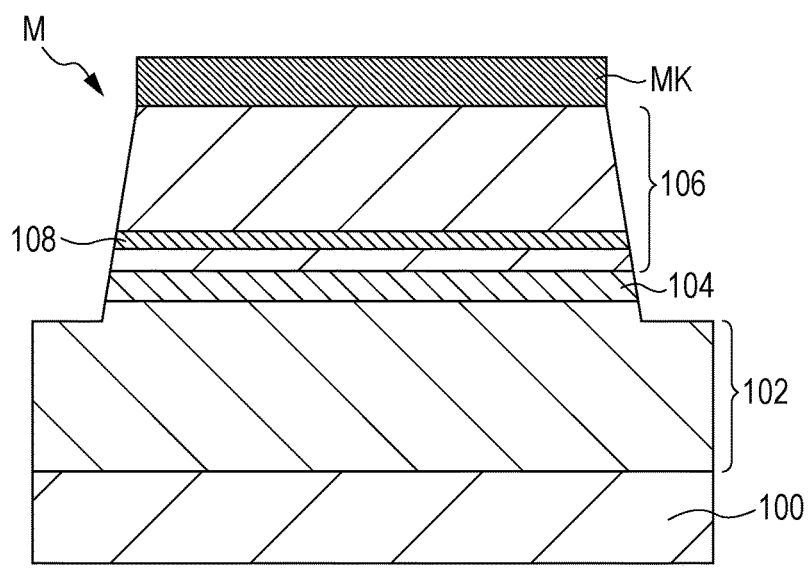
Figure 3C:
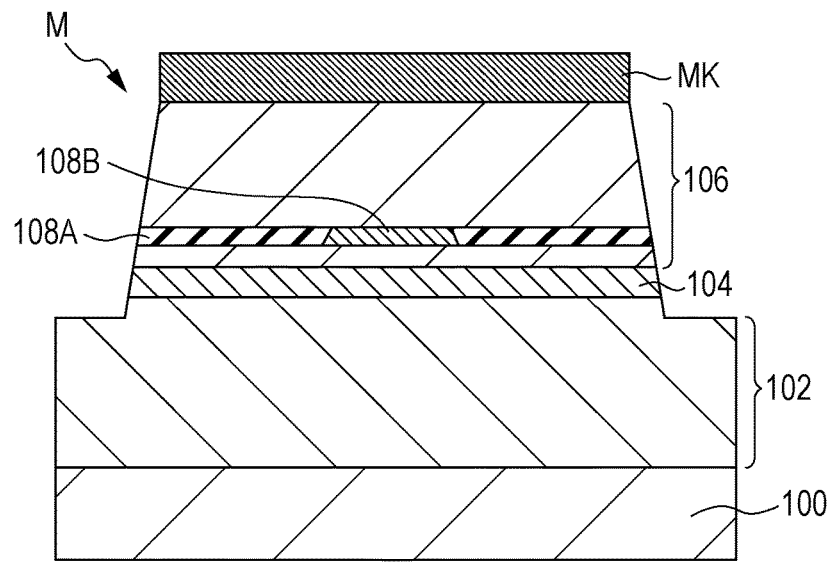

Next, a method for producing a VCSEL according to this exemplary embodiment will be described with reference to a flowchart in FIG. 2 and process sectional views in FIGS. 3A to 3C. As illustrated in FIG. 3A, an n-type lower DBR 102, an active region 104, and a p-type upper DBR 106 are stacked on an n-type GaAs substrate 100 by a metal-organic chemical vapor deposition (MOCVD) method. Subsequently, as illustrated in step S100 of FIG. 2, a mesa M is formed by etching the semiconductor layers to a depth at which a current confinement layer 108 is exposed. As illustrated in FIG. 3B, a mask MK is formed on the upper DBR 106, and exposed semiconductor layers are etched using the mask MK. The etching is performed by reactive ion etching using, for example, chlorine or chlorine and boron trichloride as an etching gas. The etching is performed to a depth at which at least the current confinement layer 108 is exposed or may be performed to a depth at which the etching reaches the lower DBR 102.

After the formation of the mesa M, the current confinement layer 108 is oxidized (S102). The substrate is transferred to an oxidation furnace, in particular, a furnace filled with a nitrogen gas containing a large amount of water vapor. Oxidation is performed by heat-treating the substrate at high temperatures. Thus, as illustrated in FIG. 3C, a portion of the current confinement layer 108 exposed at the side face of the mesa M is oxidized. By controlling the oxidation time or oxidation temperature, a conductive region 108B having a desired oxidation aperture diameter is formed in the current confinement layer 108.

After the completion of the step of oxidizing the current confinement layer 108, the substrate is heat-treated (S104). The heat treatment is performed in an atmosphere not containing moisture at a reduced pressure or in a vacuum at a substrate temperature of 150° C. or about 150° C. or higher and 400° C. or about 400° C. or lower for a predetermined time. The heat treatment in an atmosphere not containing moisture at a reduced pressure prevents further oxidation of the current confinement layer 108 and also prevents further generation of a hydroxy group in the current confinement layer 108. The reduced pressure is a value close to vacuum, preferably 100 Pa (pascal) or about 100 Pa or less, and more preferably 50 Pa or about 50 Pa or less. The atmosphere not containing moisture is an atmosphere with a partial pressure ratio of water vapor to other gases being 0.1% or less. For example, the heat treatment is performed in an inert gas atmosphere such as nitrogen ($N_2$) or argon (Ar).

The temperature of the heat treatment (heating temperature) is a substrate temperature of 150° C. or about 150° C. or higher and 400° C. or about 400° C. or lower and more preferably a substrate temperature of 190° C. or about 190° C. or higher and 400° C. or about 400° C. or lower. At a substrate temperature of 150° C. or about 150° C. or higher, an energy sufficient to convert the hydroxy group in the current confinement layer 108 into aluminum oxide ($Al_2O_3$) is supplied. The heating time is preferably 15 minutes or about 15 minutes or longer. When the heating time is 15 minutes or about 15 minutes or longer, an energy required to convert the hydroxy group in the current confinement layer 108 into aluminum oxide ($Al_2O_3$) is supplied. The heating time is more preferably 1 hour or about 1 hour or longer. In this exemplary embodiment, an evaluation test for the heating temperature and the heating time is performed to determine the above conditions. The details of the evaluation test will be described later.

Figure 4:
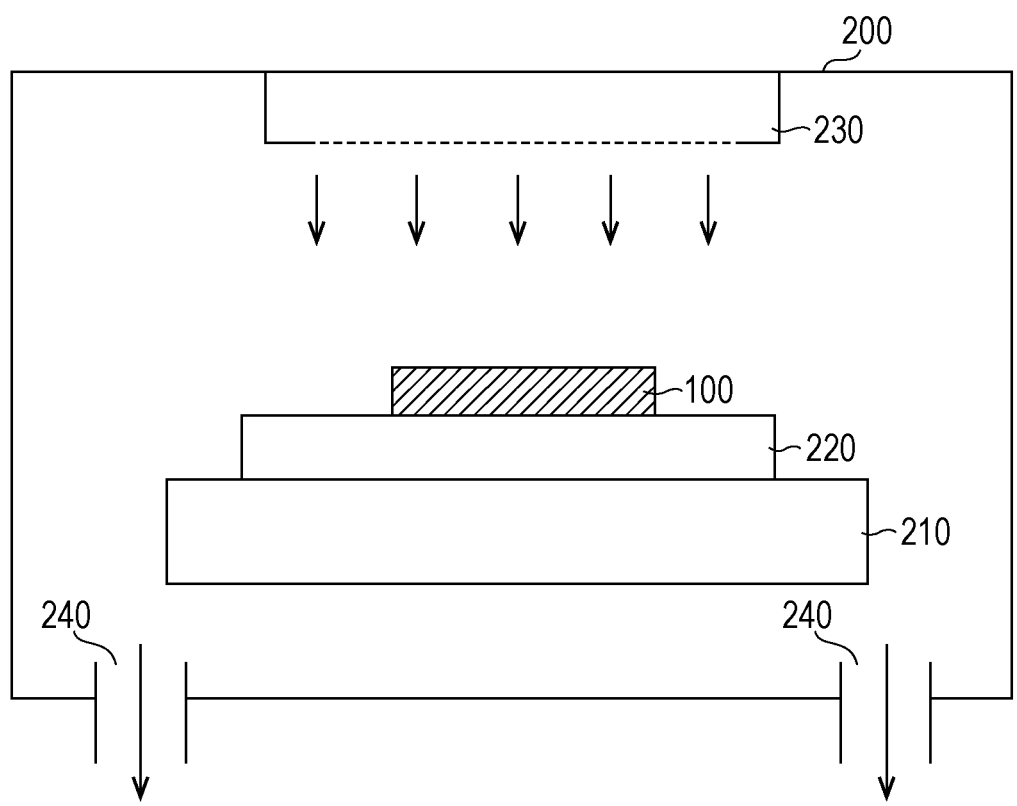
FIG. 4 is a schematic sectional view illustrating an example of a vacuum container available for heat treatment.

FIG. 4 is a sectional view illustrating an example of a vacuum container available for the heat treatment. A vacuum container 200 includes a heater 210 and a susceptor 220 that is disposed on the heater 210, is made of quartz, and has a particular thickness for supporting a substrate. For example, the heater 210 is capable of generating heat to 300° C. or higher through resistance heating, and is thus capable of heating the substrate 100 of the VCSEL placed on the susceptor 220 to 150° C. or higher. A shower plate 230 with multiple holes is disposed in an upper portion of the vacuum container 200. A jet of gas is emitted through the holes of the shower plate 230 at a particular flow rate. The shower plate 230 is capable of, for example, supplying an inert gas such as nitrogen to the vacuum container 200 at a flow rate of about 100 cc/min. This eliminates moisture in the vacuum container 200. The vacuum container 200 also includes discharge ports 240 connectable to a vacuum pump (not illustrated). By discharging air through the discharge ports 240, the pressure inside the vacuum container is reduced to a pressure lower than atmospheric pressure.

As described above, after the completion of the step of oxidizing the current confinement layer 108, the substrate 100 is transferred to the vacuum container 200 and held on the susceptor 220. The pressure inside the vacuum container 200 is reduced while pure nitrogen is supplied from the shower plate 230, and heating with the heater 210 is started. Thus, the substrate 100 is heated to 150° C. or about 150° C. or higher and 400° C. or about 400° C. or lower and heat-treated (annealed) in an atmosphere not containing moisture at reduced pressure for a predetermined time. This reduces the amount of a hydroxy group corresponding to aluminum hydroxide left in the oxidized region 108A of the current confinement layer 108.

After the completion of the heat treatment, an interlayer insulating film 112 is formed as a protective film that covers the side face of the mesa M (S106). In this exemplary embodiment, the interlayer insulating film 112 is formed by chemical vapor deposition (CVD). Examples of the CVD include thermal CVD, plasma CVD, MOCVD, and photo-CVD. Examples of a dielectric material gas used for CVD include monosilane, disilane, tetraethyl orthosilicate ($Si(OC_2H_5)_4$), $NH_3$, and $N_2O$. The protective film is not limited to insulators as long as the semiconductor layers are protected from outside air, and may be made of another material.

Figure 5A:
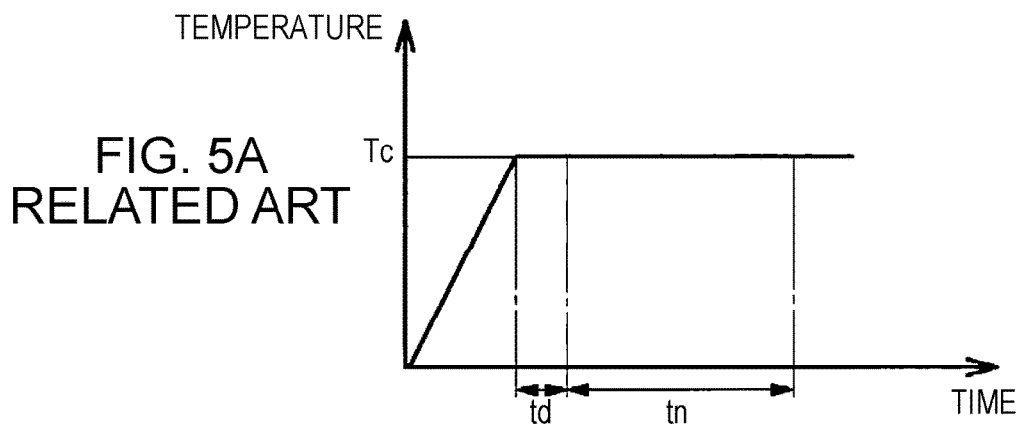
FIGS. 5A to 5D illustrate examples of the temperature and time of heat treatment according to an exemplary embodiment of the invention.
Figure 5B:
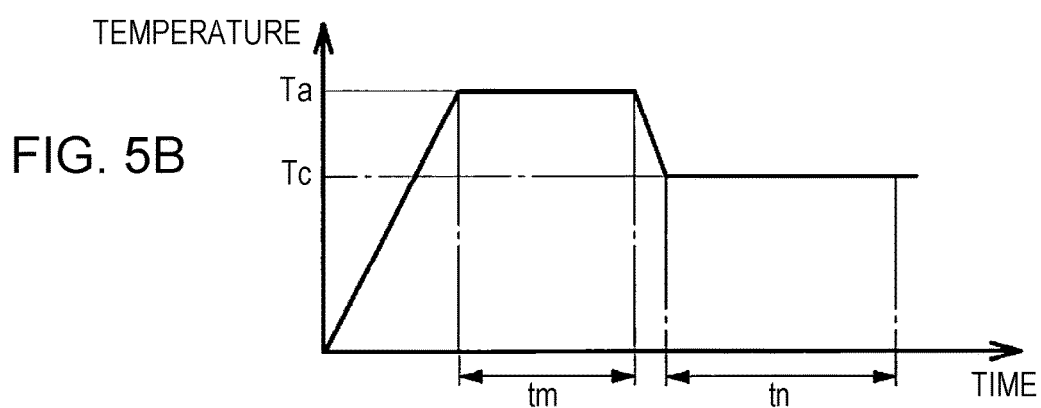
Figure 5C:
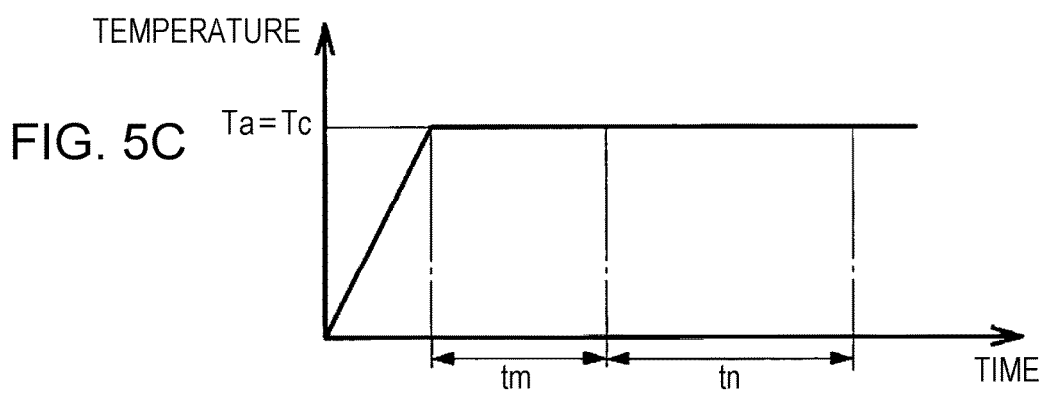
Figure 5D:
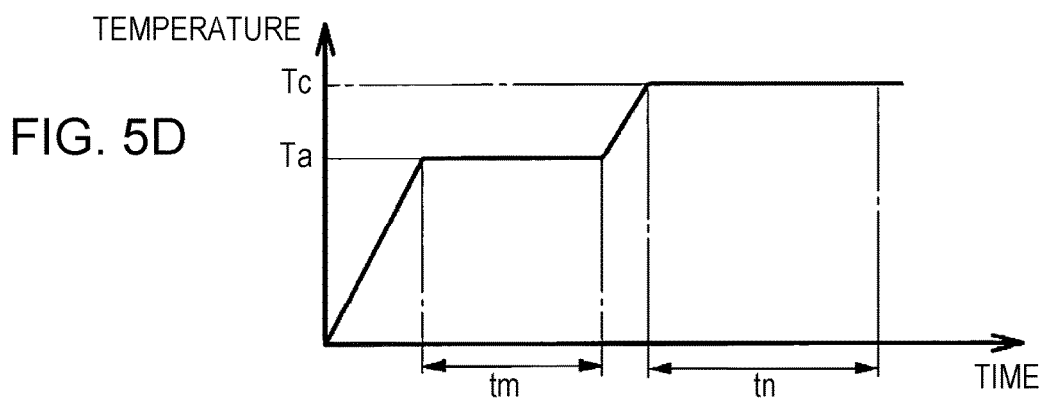

Next, the heat treatment according to this exemplary embodiment will be described with reference to FIGS. 5A to 5D. FIG. 5A illustrates a temperature profile of the related art obtained when the interlayer insulating film 112 is formed without the heat treatment. FIGS. 5B to 5D illustrates temperature profiles obtained when the interlayer insulating film 112 is formed with the heat treatment according to this exemplary embodiment.

In CVD, the temperature in a chamber is increased to high temperatures in order to react the dielectric material gas. Therefore, the substrate in the chamber is heated by this heating. In typical CVD, film formation is started as soon as the temperature in the chamber reaches a desired temperature. This is illustrated in the profile of FIG. 5A. That is, when the temperature in the chamber reaches a film formation temperature Tc, the substrate is heated for an extremely short time td while the interlayer insulating film is not formed, and then film formation is started. In this short time td, the heat treatment is not intended, and the hydroxy group in the current confinement layer 108 is not affected within the short time td. Therefore, the heating during the short time td is not regarded as the heat treatment in reality. Herein, to represents a time required for film formation.

The profile of FIG. 5B illustrates the case where the temperature Ta in the heat treatment is higher than the film formation temperature Tc in CVD. The substrate 100 is held in the vacuum container 200 in FIG. 4. When the temperature of the substrate 100 reaches the heating temperature Ta, the heating temperature Ta is kept for a heating period tm. The heating period tm is preferably at least about 15 minutes and more preferably 1 hour. After the completion of the heat treatment, the substrate is heated to the film formation temperature Tc in the same chamber or in a chamber for CVD and film formation is performed. In FIG. 5B, the temperature changes linearly from the temperature Ta in the heat treatment to the film formation temperature Tc. However, this illustration is for the sake of convenience. If the substrate is transferred to another chamber, those skilled in the art easily understand that the change in temperature from Ta to Tc is not such a linear change.

The profile of FIG. 5C illustrates the case where the heating temperature Ta in the heat treatment is substantially equal to the film formation temperature Tc in CVD. As a result of the heat treatment, the heating period tm is obviously longer than the time td in FIG. 5A. After the completion of the heat treatment, the interlayer insulating film 112 is formed by CVD. The profile of FIG. 5D illustrates the case where the heating temperature Ta in the heat treatment is lower than the film formation temperature Tc in CVD. Also in this case, the interlayer insulating film is formed by CVD after the completion of the heat treatment.

Figure 6:
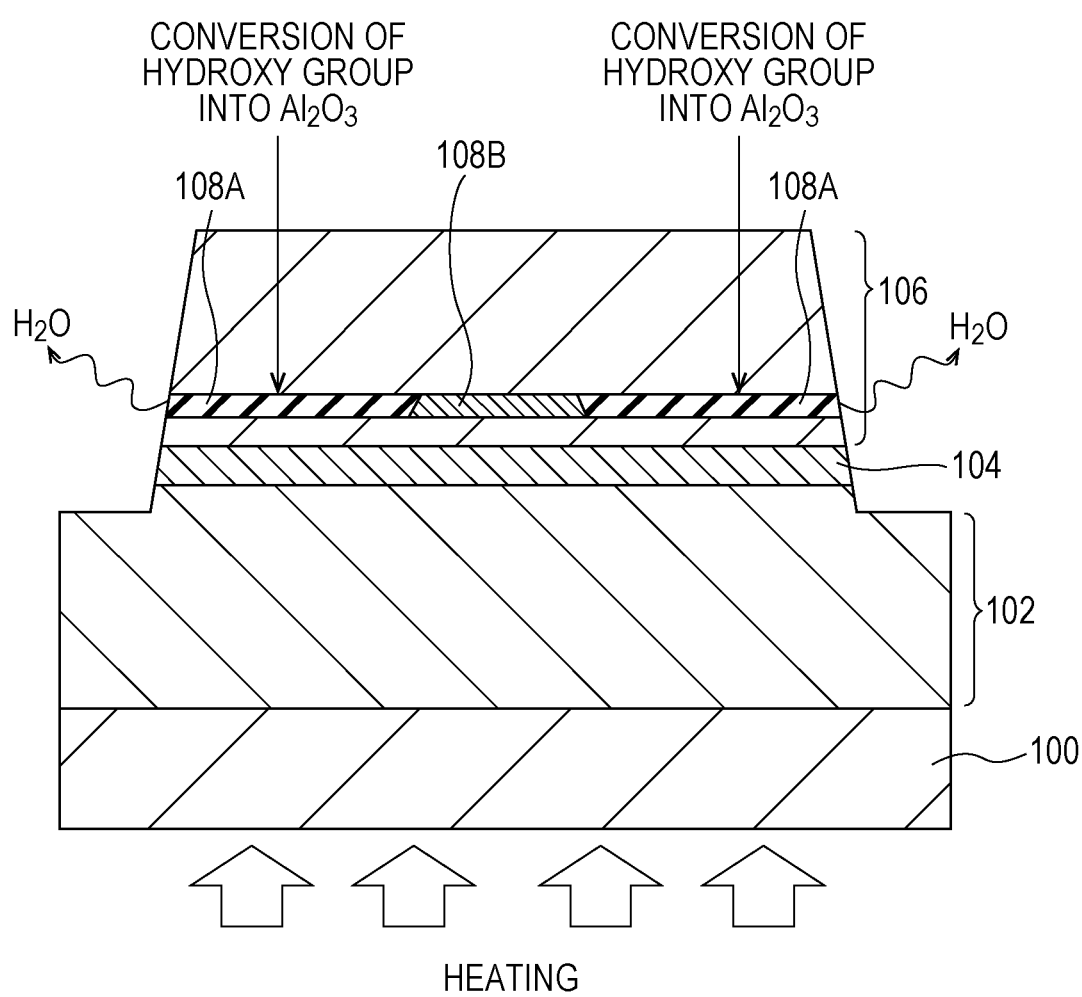
FIG. 6 illustrates an effect of a vertical cavity surface emitting laser subjected to heat treatment according to an exemplary embodiment of the invention.

Next, the effects of the heat treatment according to this exemplary embodiment will be described with reference to FIG. 6. As illustrated in FIG. 6, when the current confinement layer 108 is subjected to steam oxidation, oxidation proceeds from the side face of the mesa to the inside. As a result, an oxidized region 108A is formed and thus a conductive region 108B, which is not subjected to oxidation, is formed in the center. Herein, a hydroxy group corresponding to aluminum hydroxide such as AlO(OH) or AlO(OH)$_3$ generated as a result of the side reaction of Al and water is left in the oxidized region 108A.

By performing the heat treatment after the current confinement layer 108 is subjected to steam oxidation and before the interlayer insulating film 112 is formed, aluminum hydroxide left in the oxidized region 108A is converted into Al$_2$O$_3$, which is chemically stable aluminum oxide, by thermal energy as represented by reaction formulae below. At the same time, the water molecule H$_2$O generated as a result of the reactions is efficiently released from the side face of the mesa to the outside through an end portion of the oxidized region 108A. In the reaction formulae below, Δ represents thermal energy.

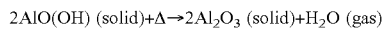

Thus, the hydroxy group that induces crystal defects is removed from the oxidized region 108A or the amount of the hydroxy group in the oxidized region 108A is reduced by performing the heat treatment between the oxidation treatment and the formation of the interlayer insulating film. This suppresses growth of crystal defects in the active layer and improves the reliability regarding a decrease in optical output.

Figure 7A:
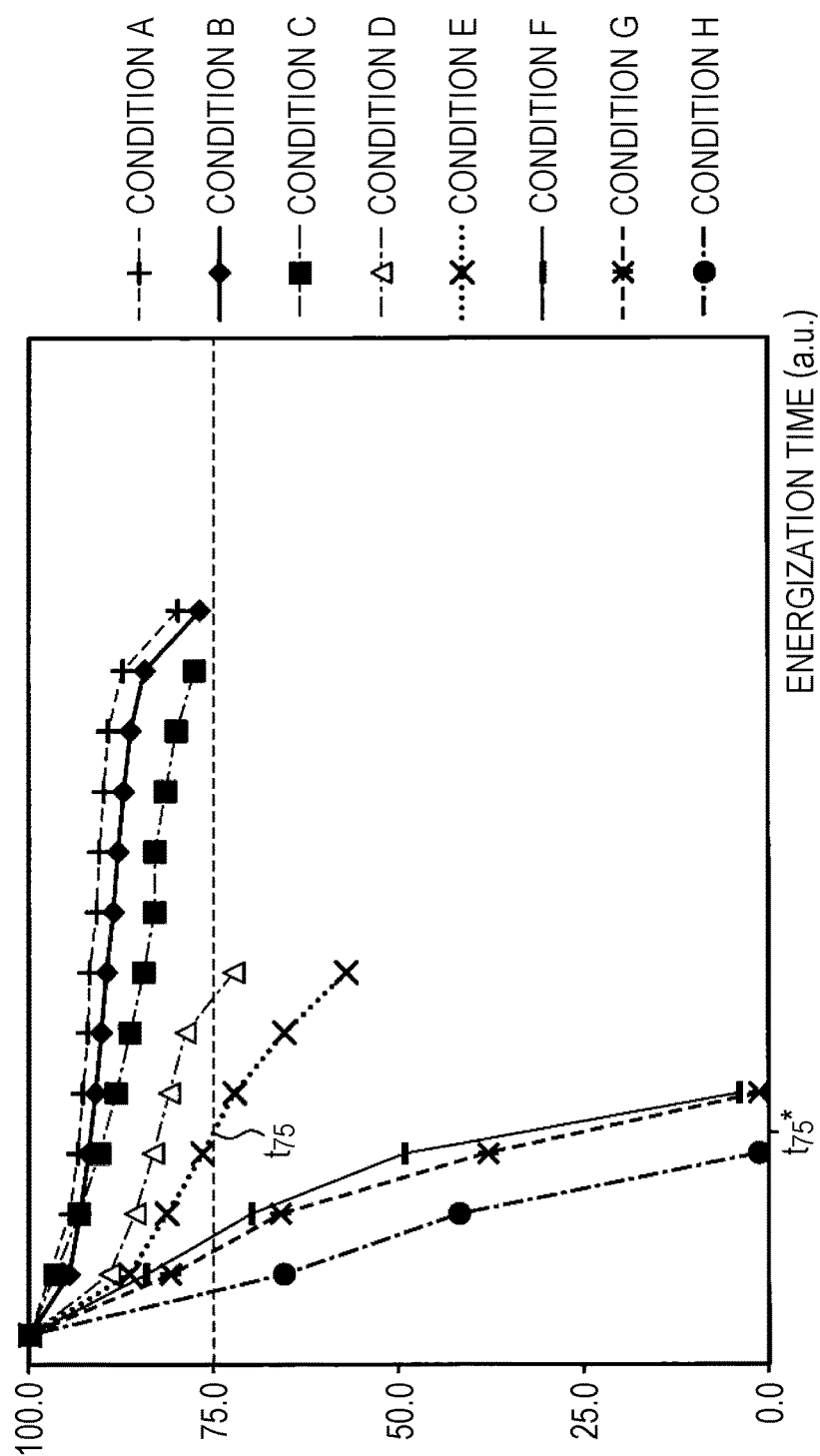

Next, the effects obtained through a specific evaluation test of the VCSEL according to this exemplary embodiment will be described with reference to FIGS. 7A to 7C. In this exemplary embodiment, an evaluation test is performed under eight conditions (Condition A to Condition H) in FIG. 7C. FIG. 7A is a graph illustrating the results of a life test obtained when the VCSEL is continuously energized. The graph shows a decrease in optical output with energization time when the optical output before the test is assumed to be 100%. FIG. 7B is a graph in which normalization is performed by assuming the life under Condition G to be 1 and the lives under the above conditions are compared with each other.

In this exemplary embodiment, the time $t_{75}$ required until the optical output decreases to 75% of the initial value is defined as a life time. In FIG. 7A, the position of the life time $t_{75}$ under Condition E is shown as an example of the life time $t_{75}$. As illustrated in FIG. 7A, the lower limit $t_{75}^*$ is set for the life time $t_{75}$. The method for producing a light-emitting device according to this exemplary embodiment is a production method in which the life time is longer than or equal to the lower limit $t_{75}^*$. The percentage of the initial value for defining the life time is not limited to 75% and may be appropriately determined in accordance with, for example, the conditions of an accelerated test.

First, Condition A to Condition H will be described with reference to FIG. 7C. In FIG. 7C, Condition A to Condition E correspond to the methods for producing a light-emitting device according to Examples, and Condition F to Condition H correspond to the methods for producing a light-emitting device according to Comparative Examples.

Condition A corresponds to the temperature profile illustrated in FIG. 5B. The heat treatment is performed in a nitrogen atmosphere at a reduced pressure of 50 Pa at a heating temperature of 400° C. for a heating time of 1 hour, and then film formation is performed at a film formation temperature of 250° C. by CVD.

Condition B corresponds to the temperature profile illustrated in FIG. 5B. The heat treatment is performed in a nitrogen atmosphere at a reduced pressure of 50 Pa at a heating temperature of 305° C. for a heating time of 1 hour, and then film formation is performed at a film formation temperature of 250° C. by CVD.

Condition C corresponds to the temperature profile illustrated in FIG. 5D. The heat treatment is performed in a nitrogen atmosphere at a reduced pressure of 50 Pa at a heating temperature of 192° C. for a heating time of 1 hour, and then film formation is performed at a film formation temperature of 250° C. by CVD.

Condition D corresponds to the temperature profile illustrated in FIG. 5B. The heat treatment is performed in a nitrogen atmosphere at a reduced pressure of 50 Pa at a heating temperature of 305° C. for a heating time of 15 minutes, and then film formation is performed at a film formation temperature of 250° C. by CVD.

Condition E corresponds to the temperature profile illustrated in FIG. 5D. The heat treatment is performed in a nitrogen atmosphere at a reduced pressure of 50 Pa at a heating temperature of 155° C. for a heating time of 1 hour, and then film formation is performed at a film formation temperature of 250° C. by CVD.

Condition F corresponds to the temperature profile illustrated in FIG. 5D. The heat treatment is performed in a nitrogen atmosphere at a reduced pressure of 50 Pa at a heating temperature of 105° C. for a heating time of 1 hour, and then film formation is performed at a film formation temperature of 250° C. by CVD.

Condition G corresponds to the temperature profile illustrated in FIG. 5A, which is a known method in which the heat treatment is not performed. That is, film formation is performed by CVD without performing the heat treatment as soon as the substrate is heated from room temperature to a film formation temperature of 250° C. over 5 minutes.

Condition H corresponds to the temperature profile illustrated in FIG. 5B. The heat treatment is performed in a nitrogen atmosphere at 101325 Pa (atmospheric pressure) at a heating temperature of 305° C. for a heating time of 1 hour, and then film formation is performed at a film formation temperature of 250° C. by CVD.

As is clear from the comparison between the plots of Condition A to Condition E (conditions according to this exemplary embodiment) and the plot of Condition G (known method) in FIG. 7A, the VCSEL produced by a known method has a life time much shorter than that of the VCSEL produced by the production method according to this exemplary embodiment. This is because the VCSEL produced by a known method is not heat-treated and thus the growth of crystal defects in the active layer is accelerated due to the influence of a hydroxy group left in the current confinement layer.

As a result of the heat treatment performed in atmospheric pressure, the VCSEL of Condition H has a life time shorter than that of the VCSEL produced under Condition G (known method). This may be because even if a hydroxy group is converted into aluminum oxide by thermal energy that comes from the heat treatment, moisture is left inside the layer without being released to the outside because of atmospheric pressure, which triggers formation of crystal defects in the active layer. Therefore, the reduced pressure is found to be a principal parameter in the heat treatment.

The VCSELs produced under Condition A to Condition E (conditions according to this exemplary embodiment) are found to have a life time much longer than that of the VCSELs produced under Condition G (known method) and Condition H (Comparative Example). As a result of further studies on the plots of Condition A to Condition H in FIG. 7A, the following has been found for production conditions.

That is, the comparison between the plot of Condition F and the plots of Condition A to Condition C and Condition E shows that the heating temperature needs to be 150° C. or higher because the life time of Condition F is much shorter than the lower limit $t_{75}*$. The comparison between the plots of Condition A to Condition C and Condition E shows that the life time increases as the heating temperature increases. There is substantially no difference in life time between Condition A and Condition B. Therefore, an effect of the heating temperature on life time is saturated at about 400° C., which indicates that a heating temperature of 400° C. or higher is meaningless.

Furthermore, if the heating temperature is excessively increased to, for example, 450° C. or higher, separation may be caused at a boundary between an oxidized layer of an AlAs layer and an AlGaAs layer due to the difference in thermal expansion coefficient between the layers. A metal for electrodes and Ga excessively form an alloy, which may cause a partial loss of electrodes and a partial loss of epitaxial layers. Moreover, a phenomenon in which As is separated and Ga is precipitated may occur. In addition, if the step of forming an emission protective film in a light-emitting aperture is employed before the oxidation step, the emission protective film may be separated. For the above reasons, the upper limit of the heating temperature is 400° C. in this exemplary embodiment. On the other hand, the comparison between the plots of Condition A to Condition C and the plot of Condition E shows that the life time increases considerably at a heating temperature of 190° C. or higher. Therefore, the lower limit of the heating temperature is 190° C.

As is clear from the plot of Condition B and the plot of Condition D, the heating time needs to be 15 minutes or longer and is suitably 1 hour.

In view of the foregoing, the heat treatment in the method for producing a light-emitting device according to this exemplary embodiment is performed under the following conditions.

The heating temperature is 150° C. or about 150° C. or higher and 400° C. or about 400° C. or lower and preferably 190° C. or about 190° C. or higher and 400° C. or about 400° C. or lower.

The heating time is 15 minutes or about 15 minutes or longer and preferably 1 hour or about 1 hour or longer.

The reduced pressure is a value close to vacuum, preferably 100 Pa or about 100 Pa or less, and more preferably 50 Pa or about 50 Pa or less.

Figure 8:
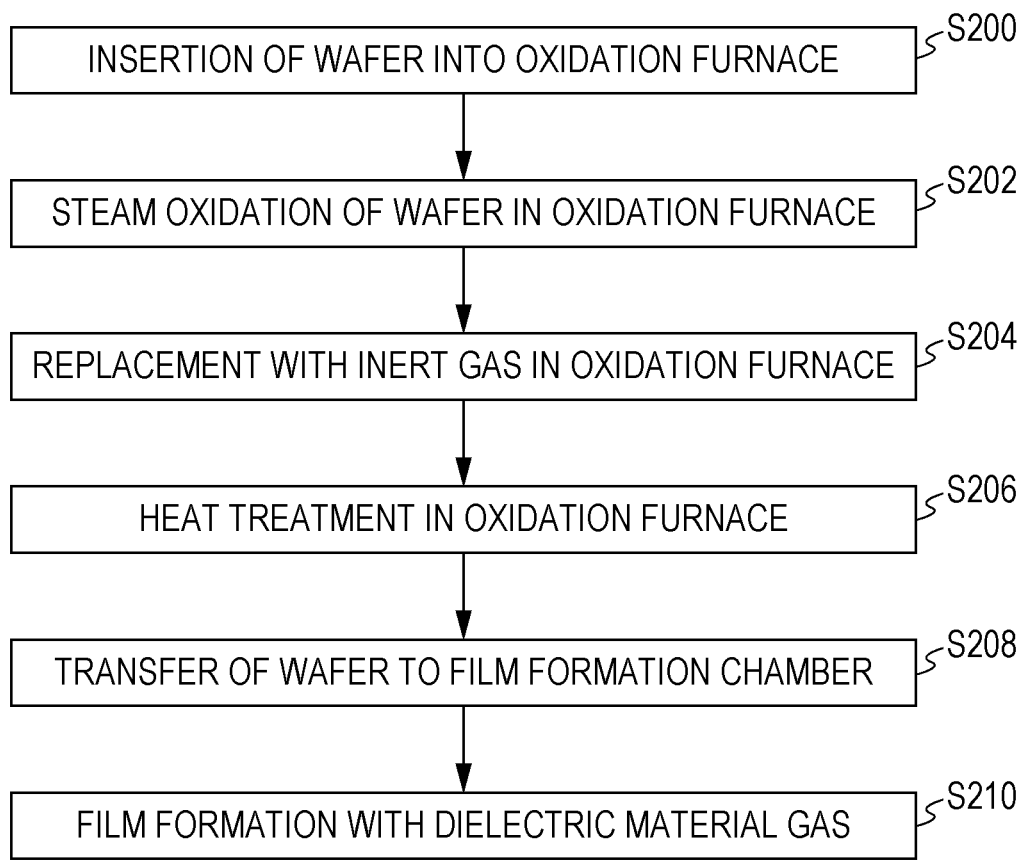
FIG. 8 is a flowchart illustrating an example of heat treatment according to an exemplary embodiment of the invention.

Next, examples of the heat treatment and CVD film formation treatment in the production method according to this exemplary embodiment will be described. FIG. 8 illustrates an example of a process for performing heat treatment in an oxidation furnace in which the VCSEL is subjected to an oxidation treatment. First, a wafer (substrate) for a VCSEL is inserted into an oxidation furnace (S200). Then, a current confinement layer is subjected to steam oxidation in the oxidation furnace (S202). Then, the gas containing water vapor in the oxidation furnace is replaced with an inert gas such as nitrogen or argon (S204). Then, the wafer is heat-treated in the oxidation furnace (S206). After the completion of the heat treatment, the wafer is taken out of the oxidation furnace and transferred to a chamber for forming a film by CVD (S208). A dielectric material gas is introduced into the chamber and a film is formed by CVD (S210). Through these steps, the oxidation treatment and the heat treatment are continuously performed in the same oxidation furnace, which improves the production efficiency.

Figure 9:
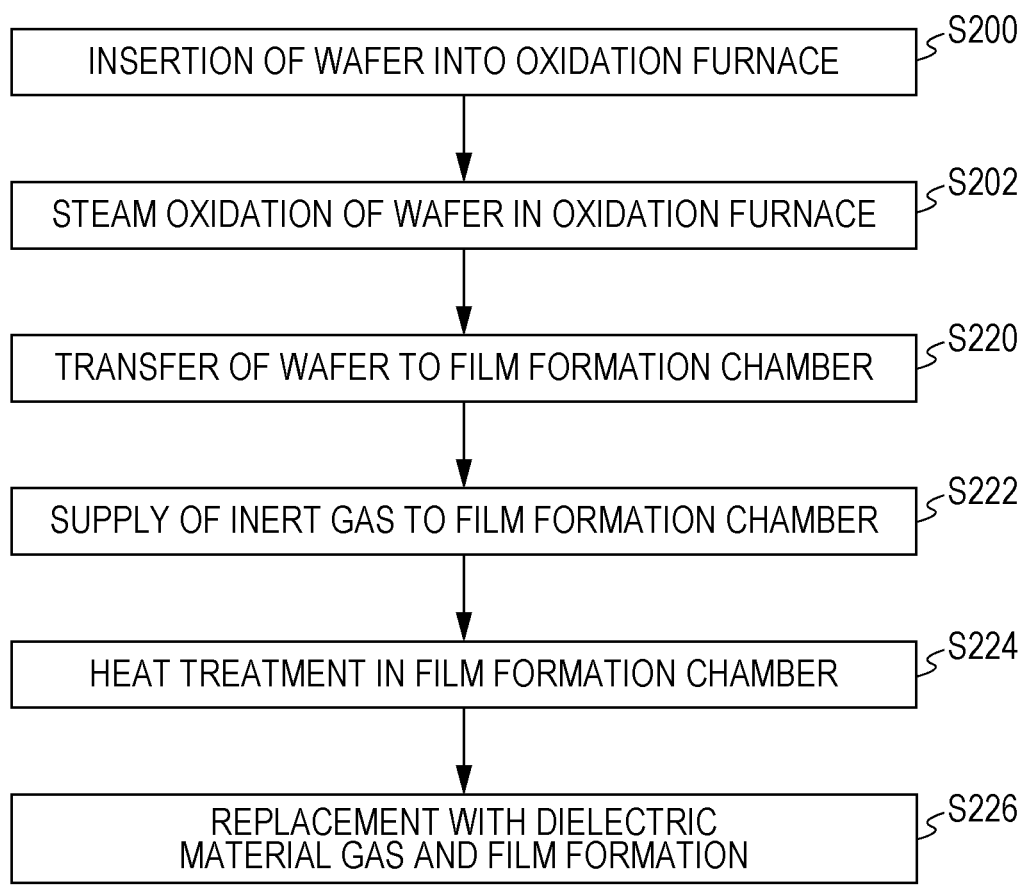
FIG. 9 is a flowchart illustrating another example of heat treatment according to an exemplary embodiment of the invention.

FIG. 9 illustrates an example of a process for performing a heat treatment and a film formation treatment in the same chamber. The steps S200 and S202 are the same as those in FIG. 8. After the completion of the oxidation of the current confinement layer, a wafer is transferred to a film formation chamber (S220). Then, the film formation chamber is filled with an inert gas such as nitrogen or argon (S222) and a heat treatment is performed in the film formation chamber (S224). After the completion of the heat treatment, the inert gas in the film formation chamber is replaced with a dielectric material gas and a film is formed (S226). Through these steps, the heat treatment and the film formation treatment are continuously performed in the same chamber, which improves the production efficiency.

Figure 10:
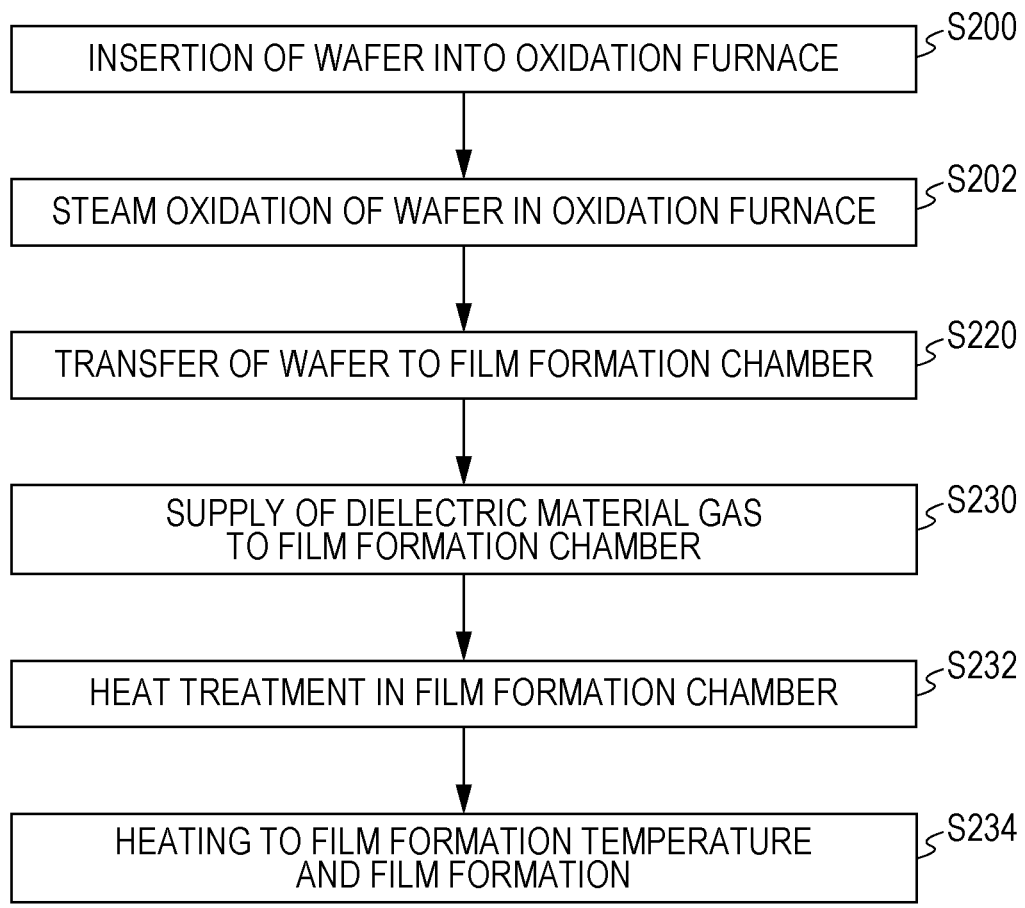
FIG. 10 is a flowchart illustrating still another example of heat treatment according to an exemplary embodiment of the invention.

The process in FIG. 10 is a modification of the process in FIG. 9. The steps S200, S202, and S220 are the same as those in FIG. 9. After the wafer is transferred to the film formation chamber, a dielectric material gas is supplied to the film formation chamber (S230). A heat treatment is performed in an atmosphere containing the dielectric material gas (S232). This treatment is effective when the heating temperature Ta is lower than the film formation temperature Tc as illustrated in FIG. 5D. After the completion of the heat treatment, the temperature in the film formation chamber is increased to a film formation temperature and a film is formed (S234).

Next, another exemplary embodiment according to the invention will be described. In the above exemplary embodiment, it has been described that after the heat treatment, the interlayer insulating film (dielectric film) that covers the mesa is formed by CVD. In the other exemplary embodiment, after the heat treatment, a liquid-phase material is used for a protective member for covering the side face of the mesa.

Examples of a method for using the liquid-phase material for a protective member include coating methods such as potting of the liquid-phase material on a wafer surface and spin coating in which the liquid-phase material is added dropwise to a rotated wafer. These coating methods are normally performed at atmospheric pressure and ordinary temperature. It is also possible to perform a heat treatment for curing a coated liquid-phase material. Examples of the liquid-phase material include benzocyclobutene resin (BCB resin), polyimide resin, inorganic material-containing spin-on-glass, and spin-on dielectric material (silica glass).

Figure 11:
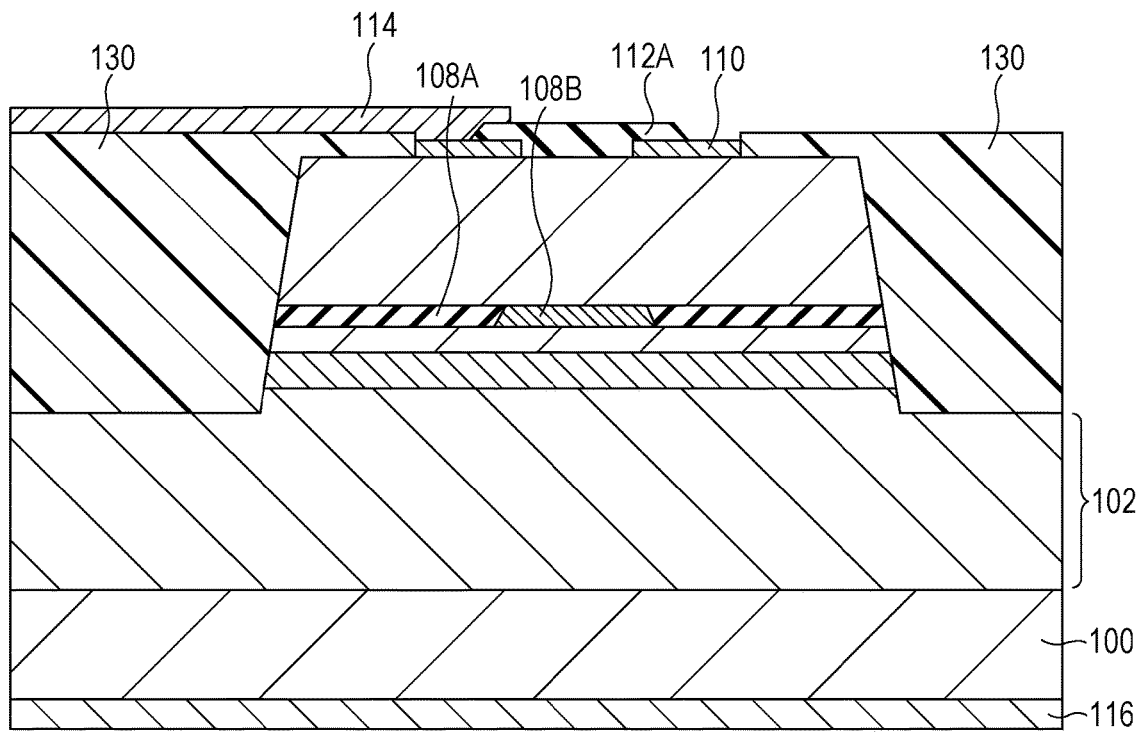
FIG. 11 is a schematic sectional view illustrating a vertical cavity surface emitting laser according to another exemplary embodiment of the invention.

FIG. 11 is a sectional view illustrating a VCSEL 10A produced by a method according to the other exemplary embodiment. The same parts as those in FIG. 1 are denoted by the same reference numerals. As in the above-described exemplary embodiment, in the VCSEL 10A according to this exemplary embodiment, a current confinement layer 108 is subjected to an oxidation treatment, heat treatment is performed, a liquid-phase material 130 is applied so as to cover the mesa M, and then the liquid-phase material 130 is cured. The liquid-phase material 130 may be optionally etched back to obtain a flat surface or may be optionally patterned to form a contact hole. A metal wiring line 114 is formed so as to extend along the surface of the liquid-phase material 130. When the liquid-phase material 130 having a large thickness is present directly below the metal wiring line 114, the capacitance of the metal wiring line 114 is reduced. Therefore, the VCSEL 10A according to the other exemplary embodiment is suitable as a light source for high-speed driving devices used in optical communications and the like.

In the above exemplary embodiment, it has been described that the side face of the mesa is protected by film formation by CVD or coating with the liquid-phase material. In addition, an insulating film may be formed using a solid-phase material. The solid-phase material is formed by physical vapor deposition (PVD). Examples of the PVD include sputtering, vacuum deposition, ion beam deposition, molecular beam deposition, and ion plating. In the case of the PVD, the wafer may be heated during deposition.

In the above exemplary embodiment, the mesas illustrated in FIG. 1 and FIG. 11 have been exemplified. However, the mesa is not necessarily present in the step of oxidizing the current confinement layer. For example, a hole having a particular depth is formed by etching in a direction from the surface of the upper DBR toward the lower DBR. In particular, such a hole is formed in such a manner that multiple holes are arranged in a circular shape about the optical axis. Then, the current confinement layer exposed at the side faces of the holes is oxidized. In this case, multiple circular oxidized regions that concentrically expand from the center of the holes are connected to each other, and a non-oxidized region (oxidation aperture) is surrounded by the oxidized regions.

In the above exemplary embodiment, the case where the present invention is applied to a VCSEL has been described. However, any device other than the VCSEL may be used as long as the device includes a current confinement layer subjected to steam oxidation. For example, the present invention may be applied to light-emitting diodes and light-emitting thyristors including a current confinement layer subjected to steam oxidation.

The exemplary embodiments according to the present invention have been described in detail, but the present invention is not limited to a particular exemplary embodiment. Various modifications and changes may be made within the scope of the sprit of the present invention described in the claims.

What is claimed is:

1. A method for producing a light-emitting device, the method comprising:
    oxidizing a current confinement layer containing Al by steam oxidation from a side face of a light-emitting element portion including the current confinement layer to form a current confinement structure in the light-emitting element portion;
    heating the light-emitting element portion to about 150° C. or higher and about 400° C. or lower at reduced pressure for a predetermined heating time while the oxidized current confinement layer is exposed at the side face; and
    after the light-emitting element portion is heated, forming a protective film on the side face,
    wherein the light-emitting element portion is heated to a temperature at which aluminum hydroxide in the current confinement layer is converted into aluminum oxide.

2. The method according to claim 1, wherein the light-emitting element portion is heated by replacing, with an inert gas, a gas in an oxidation furnace where a wafer including the light-emitting element portion formed thereon is held and by heating the wafer at reduced pressure.

3. The method according to claim 1, wherein the protective film is formed on the side face by chemical vapor deposition while being heated at reduced pressure.

4. The method according to claim 1,
    wherein the light-emitting element portion is heated by heating a wafer including the light-emitting element portion formed thereon in a film formation furnace with an inert gas atmosphere at reduced pressure, and
    after the inert gas in the film formation furnace is replaced with a gas for film formation, the protective film is formed on the side face by chemical vapor deposition while being heated at reduced pressure.

5. The method according to claim 1, wherein a temperature to which the light-emitting element portion is heated is higher than a film formation temperature at which the protective film is formed.

6. The method according to claim 1, wherein a temperature to which the light-emitting element portion is heated is lower than a film formation temperature at which the protective film is formed.

7. The method according to claim 1, wherein a film formation temperature at which the protective film is formed is equal to a temperature to which the light-emitting element portion is heated.

8. The method according to claim 1, wherein the heating time for which the light-emitting element portion is heated is about 1 hour or longer.

9. The method according to claim 1, wherein the reduced pressure at which the light-emitting element portion is heated is about 100 Pa or less.

10. A method for producing a light-emitting device, the method comprising:
    oxidizing a current confinement layer containing Al by steam oxidation from a side face of a light-emitting element portion including the current confinement layer to form a current confinement structure in the light-emitting element portion;
    heating the light-emitting element portion to about 150° C. or higher and about 400° C. or lower at reduced pressure for a predetermined heating time while the oxidized current confinement layer is exposed at the side face; and
    after the light-emitting element portion is heated, forming a protective film on the side face,
    wherein the light-emitting element portion is heated in an inert gas atmosphere.

11. A method for producing a light-emitting device, the method comprising:
    oxidizing a current confinement layer containing Al by steam oxidation from a side face of a light-emitting element portion including the current confinement layer to form a current confinement structure in the light-emitting element portion;
    heating the light-emitting element portion to about 150° C. or higher and about 400° C. or lower at reduced pressure for a predetermined heating time while the oxidized current confinement layer is exposed at the side face; and after the light-emitting element portion is heated, forming a protective film on the side face, wherein a heating time for which the light-emitting element portion is heated is at least about 15 minutes.

12. A method for producing a light-emitting device, the method comprising:

oxidizing a current confinement layer containing Al by steam oxidation from a side face of a light-emitting element portion including the current confinement layer to form a current confinement structure in the light-emitting element portion;

heating the light-emitting element portion to about 150° C. or higher and about 400° C. or lower at reduced pressure for a predetermined heating time while the oxidized current confinement layer is exposed at the side face; and after the light-emitting element portion is heated, covering the side face with a protective member made of a liquid-phase material, wherein a heating time for which the light-emitting element portion is heated is at least about 15 minutes.

13. The method according to claim 12, wherein the side face is covered with the protective member made of the liquid-phase material by coating the side face with a resin or an inorganic material-containing liquid.

14. The method according to claim 12, wherein the side face is covered with the protective member made of the liquid-phase material at ordinary temperature or at atmospheric pressure.

15. The method according to claim 12, wherein the heating time for which the light-emitting element portion is heated is about 1 hour or longer.

16. The method according to claim 12, wherein the reduced pressure at which the light-emitting element portion is heated is about 100 Pa or less.

17. A method for producing a light-emitting device, the method comprising:

oxidizing a current confinement layer containing Al by steam oxidation from a side face of a light-emitting element portion including the current confinement layer to form a current confinement structure in the light-emitting element portion;

heating the light-emitting element portion to about 150° C. or higher and about 400° C. or lower at reduced pressure while the oxidized current confinement layer is exposed at the side face; and after the light-emitting element portion is heated and the temperature and the pressure are changed to a temperature and a pressure at which the side face is covered with a protective member, covering the side face with the protective member, wherein energy used to heat the light-emitting element portion is sufficient for converting aluminum hydroxide in the oxidized current confinement layer into aluminum oxide.

18. The method according to claim 17, wherein the temperature to which the light-emitting element portion is heated is set to be higher than the temperature at which the side face is covered with the protective member.

* * * * *